United States Patent

Darthenay et al.

[11] Patent Number: 5,917,380
[45] Date of Patent: Jun. 29, 1999

[54] DIGITALLY GAIN-CONTROLLED AMPLIFIER, AND CAMERA USING SUCH AN AMPLIFIER

[75] Inventors: Frédéric Darthenay, St. Aubin/Mer; Richard Morisson, Caen; Denis Raoulx, Paris, all of France

[73] Assignee: U.S. Philips Corporation, New York, N.Y.

[21] Appl. No.: 08/873,374

[22] Filed: Jun. 12, 1997

[30] Foreign Application Priority Data

Jun. 14, 1996 [FR] France ..................................... 96 07446

[51] Int. Cl.⁶ ...................................................... H03G 3/30
[52] U.S. Cl. .............................. 330/278; 330/254; 396/99
[58] Field of Search ................................... 330/129, 254, 330/278, 279, 308; 396/99

[56] References Cited

U.S. PATENT DOCUMENTS 4,843,417  6/1989  Ishida et al. .............................. 396/100
5,530,404  6/1996  Debroux ................................... 330/278

*Primary Examiner*—Steven J. Mottola
*Attorney, Agent, or Firm*—Gregory L. Thorne

[57] ABSTRACT

The invention relates to a digitally gain-controlled amplifier including a transconductance stage provided with means for producing, at each of its N current outputs, a current (Itr) having a variable component which is representative of the analog input voltage. The amplifier also includes a switching stage comprising N switches each controlling the activation or deactivation of one of the N current outputs of the transconductance stage. Finally, the amplifier has a current/voltage conversion stage having one voltage output constituting the analog output of the amplifier and supplying a voltage which is representative of the currents received at its N current inputs.

8 Claims, 3 Drawing Sheets

DIGITALLY GAIN-CONTROLLED AMPLIFIER, AND CAMERA USING SUCH AN AMPLIFIER

FIELD OF THE INVENTION

The invention relates to the field of gain-controlled amplifiers having an analog input for receiving an analog input voltage, a digital input for receiving a word of N bits, referred to as control word, for controlling the gain of the amplifier, and an analog output for supplying an analog output voltage.

BACKGROUND OF THE INVENTION

The majority of amplifiers which are gain-controlled by means of a digital control word comprise a D/A converter converting the control word into an analog signal. This signal is subsequently used, either for controlling the conduction of a current source which biases an amplifier stage by means of which the analog input voltage is effectively amplified, or as a multiplicand of the analog input signal in a multiplier circuit.

The above citations are hereby incorporated in whole by reference.

SUMMARY OF THE INVENTION

These gain-controlled amplifiers thus have two major drawbacks: the D/A converter which they comprise leads to a large-size circuit, and the error produced during conversion of the control word turns out to be multiplied by the intrinsic gain of the amplifier.

It is an object of the invention to remedy these drawbacks by providing an amplifier in which the control word acts directly on the result of amplifying the analog input voltage.

A gain-controlled amplifier according to the invention comprises:

- a transconductance stage having a voltage input which constitutes the analog input of the amplifier, and N current outputs, provided with means for producing, at each N current output, a current having a variable component which is representative of the analog input voltage,
- a switching stage having N control inputs and comprising N switches each controlled by a signal received at one of the N control inputs, each switch controlling the activation or deactivation of one of the current Outputs of the transconductance stage, the N control inputs constituting the digital input of the amplifier for receiving the control word,
- a current/voltage conversion stage having N current inputs and one voltage output, the N current inputs being connected to N current outputs of the transconductance stage, the voltage output constituting the analog output of the amplifier and supplying a voltage which is representative of the currents received at its N current inputs.

In such an amplifier, the actual amplification takes place directly in the transconductance stage and independently of the value of the control word. The switching stage allows the control word to directly select those outputs of the transconductance stage which must be activated. The analog output voltage is the result of a linear combination of the outputs of the transconductance stage, which combination is realized by the current/voltage conversion stage. The result of this combination varies as a function of the number and nature of the outputs of the transconductance stage which are active, and hence of the digital value of the control word.

A preferred embodiment of the invention comprises:

- a biasing stage having N Outputs and constituted by N current sources, each having a terminal connected to a negative power supply terminal, the other terminal constituting one of said N outputs;
- a transconductance stage having a voltage input which constitutes the analog input of the amplifier, N current inputs connected to N outputs of the biasing stage, and N current outputs, and constituted by N transconductance modules each having a voltage input connected to the voltage input of the stage, a current input constituting a current input of the stage, and a current output constituting one of the N current outputs of the stage and supplying a current having a variable component which is representative of the analog input voltage;
- a switching stage having N control inputs, N current inputs and N current outputs, and comprising N switches each controlled by a signal received at one of the N control inputs, one of the terminals of each switch constituting one of the N current inputs of the stage, the other terminal constituting one of the N current outputs of the stage, the N current inputs of the stage being connected to N current outputs of the transconductance stage, the N control inputs constituting the digital input of the amplifier for receiving the control word; and
- a current/voltage conversion stage having N current inputs and one voltage output, the N current inputs being connected to N current outputs of the switching stage, the voltage output constituting the analog output of the amplifier and supplying a voltage which is representative of the currents received at its N current inputs.

Another preferred embodiment of the invention provides a current/voltage conversion stage that comprises an R/2R network in which two successive current inputs are interconnected via a resistor having a nominal value which is equal to R, the current input connected to the transconductance stage's output which is controlled by the most significant bit of the control word being connected to the analog output of the amplifier via a resistor having a nominal value which is equal to R, the current input connected to the transconductance stage' output which controlled by the least significant bit of the control word being connected to the negative power supply terminal via a resistor having a nominal value which is equal to R, each of the other current inputs being connected to the negative power supply terminal via a resistor having a nominal value which is equal to 2R.

The current/voltage conversion realized by the R/2R network allows a weighting of the contribution of the current received at each current input as a function of the rank occupied by the latter. Such a configuration is thus well-adapted to applications in which the value at the output depends on a digital control word with bits of different weights.

This is particularly useful in a variant of the invention which provides a gain-controlled amplifier as described above, which is characterized in that all the current sources of the biasing stage have an identical construction and are each provided with a control input for controlling the current value supplied thereby as a function of the value of the control word.

In such a current amplifier, only the R/2R network ensures the weighting which is necessary for controlling the amplifier gain as a function of the value of the control word.

A variant of the invention provides a transconductance module with means for producing at its current output a current whose variable component is independent of the value of the current supplied by the current source to which said module is connected.

This variant of the invention allows the DC level of the analog output voltage to be set by modifying the value of the current supplied by the current sources of the biasing stage without having to modify the value of the gain applied to the analog input voltage.

An advantageous embodiment of the invention exploits this possibility by providing an amplifier comprising a comparator having one Output and two inputs, one of which receiving a reference voltage while the other receives the output voltage of the amplifier, the output of the comparator being connected to the control input of each current source of the biasing stage.

Another advantageous embodiment of the invention also allows the DC level of the analog output voltage to be set, and provides a gain-controlled amplifier as described above, which is characterized in that the amplifier comprises an associative memory addressed by at least one part of the control word and supplying a precomputed digital value at its output corresponding to the configuration of said part of the control word, the amplifier also comprising a D/A converter having a digital input which is connected to the output of the associative memory and an analog output which is connected to the control input of each current source of the biasing stage.

The invention also relates to a camera comprising:

a device for detecting light and converting the light into analog electronic signals;

an amplifier having an analog signal input intended to receive said analog electronic signals, a digital input intended to receive a digital word, referred to as control word, for controlling the gain of the amplifier, and an analog signal output;

an A/D converter having an analog input connected to the Output of the amplifier, and a digital output; and a digital processing unit having an input connected to the output of the A/D converter, which unit is intended to apply the control word to the amplifier.

Those skilled in the art will understand the invention and additional objects and advantages of the invention by studying the description of preferred embodiments below with reference to the following drawings which illustrate every feature of the appended claims:.

DETAILED DESCRIPTION OF THE PREFERRED EMBODIMENTS

Figure 1:
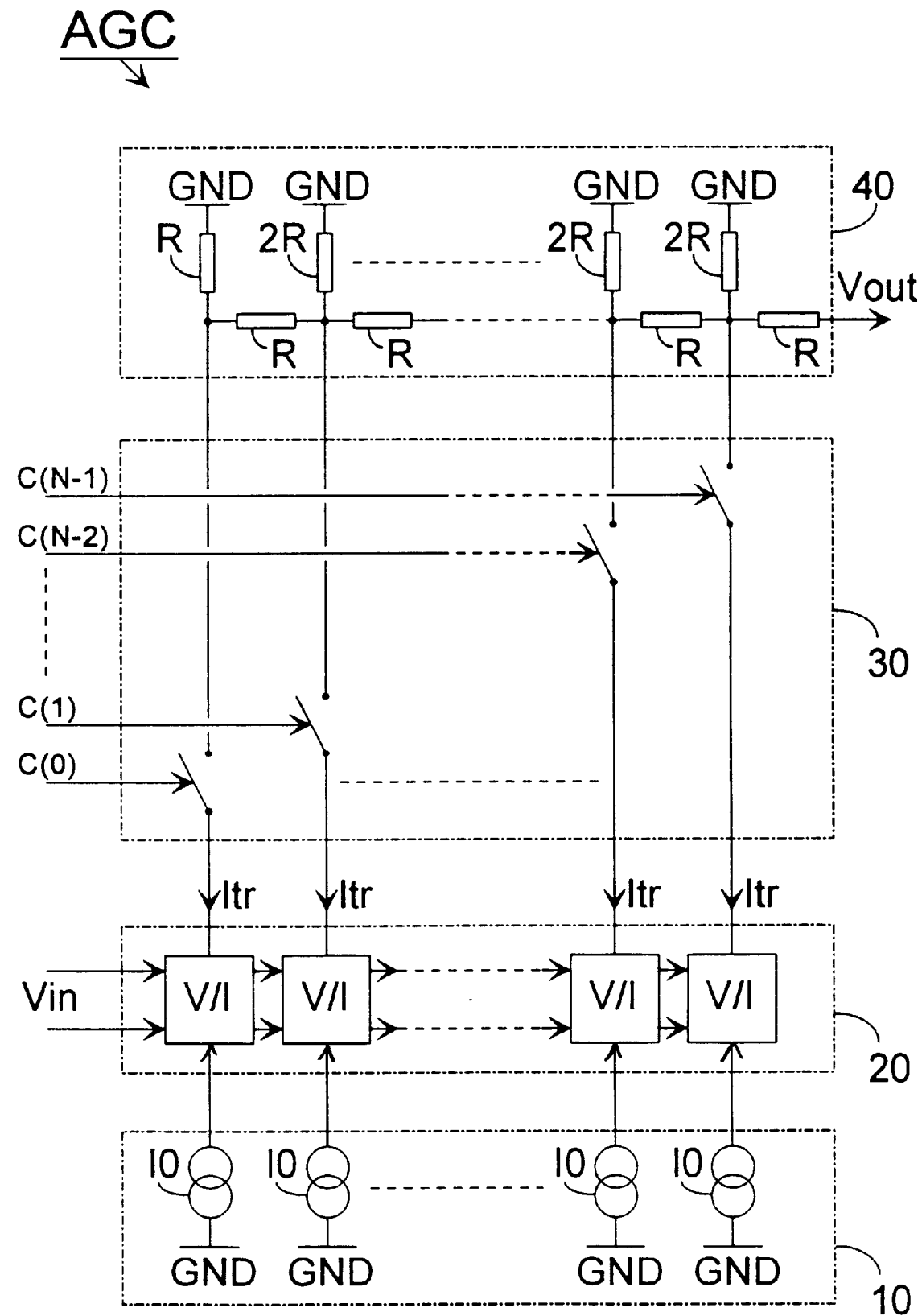
FIG. 1 is a diagram partially illustrating a gain-controlled amplifier according to the invention.

As is shown in FIG. 1, a gain-controlled amplifier AGC according to the invention comprises:

a biasing stage 10 having N outputs and constituted by N current sources IO, each having a terminal connected to a negative power supply terminal GND, the other terminal constituting one of said N outputs;

a transconductance stage 20 having a voltage input constituting the analog input of the amplifier, N current inputs connected to N outputs of the biasing stage, and N current outputs, and constituted by N transconductance modules V/I, each having a voltage input connected to the voltage input of the stage, a current input constituting a current input of the stage, and a current output constituting one of the N current outputs of the stage and supplying a current Itr having a variable component which is representative of the analog input voltage Vin;

a switching stage 30 having N control inputs, N current inputs and N current outputs and comprising N switches each controlled by a signal C(0), . . . C(N−1) received at one of the N control inputs, one of the terminals of each switch constituting one of the N current inputs of the stage, the other terminal constituting one of the N current outputs of the stage, the N current inputs of the stage being connected to N current outputs of the transconductance stage, the N control inputs constituting the digital input of the amplifier for receiving the control word C(0:N−1);

a current/voltage conversion stage 40 having N current inputs and one voltage output, the N current inputs being connected to N current outputs of the switching stage, the voltage output constituting the analog output of the amplifier and supplying a voltage Vout which is representative of the currents received at its N current inputs. This current/voltage conversion stage 40 is an R/2R network in this example.

In such a gain-controlled amplifier, the current Itr can be written as IO/2+K.Vin.IO/2, or as (1+K.Vin).IO/2. Because of the nature of the switching stage and the properties of the R/2R network, the Output voltage Vout of the amplifier is equal to Itr.R.CODE/$2^N$, where CODE is the decimal value of the control word, and can thus be written as (1+K.Vin).R.IO.CODE/$2^{N+1}$. The dynamic gain Gd, defined as the ratio between the variable components of the output voltage and the input voltage, can then be written as Gd=K.IO.R.CODE/$2^{N+1}$ and is effectively determined by the value CODE of the control word.

The outputs of the transconductance stage are asymmetrical in this case. In the case where these outputs are symmetrical, the switches of the switching stage are doubled and the current/voltage conversion stage is, for example, constituted by a double R/2R network which then supplies a symmetrical analog output voltage.

Figure 2:
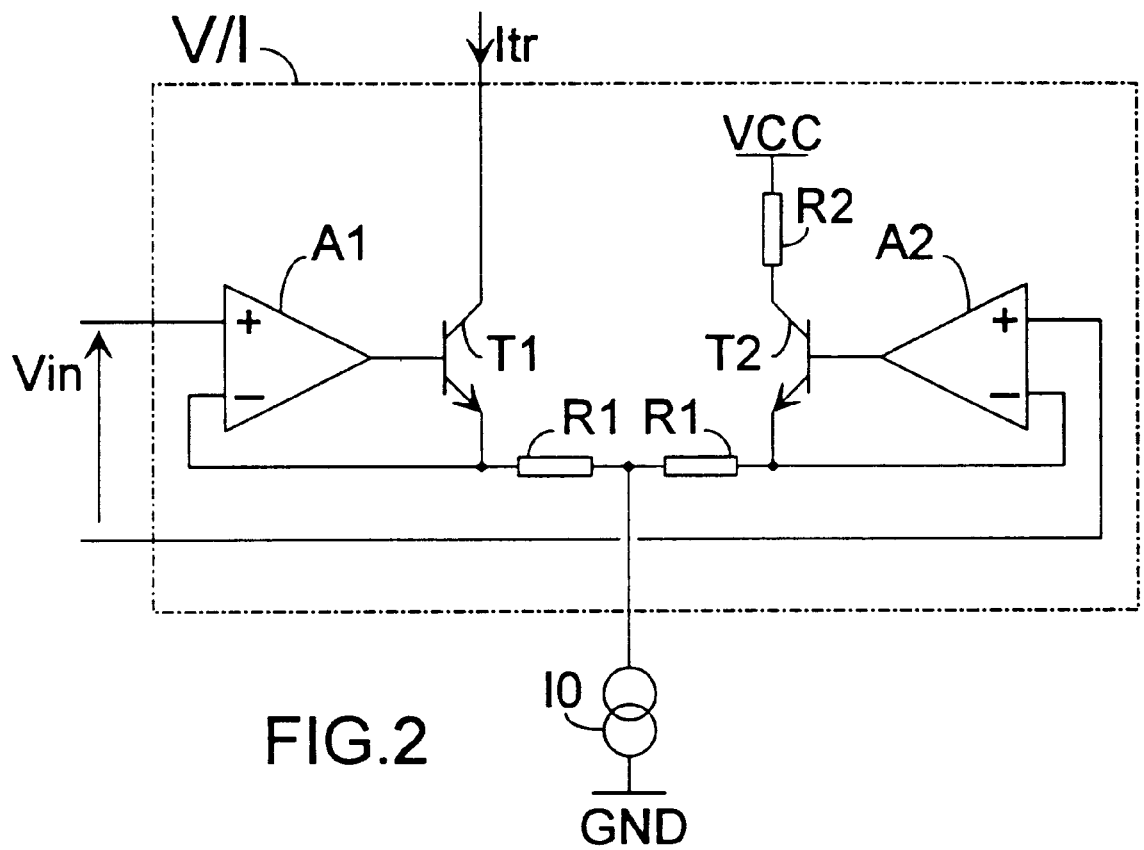
FIG. 2 is a diagram showing a transconductance module arranged in a gain-controlled amplifier in accordance with a variant of the invention.

FIG. 2 shows diagrammatically a transconductance module V/I arranged in a gain-controlled amplifier AGC in accordance with a variant of the invention. The module comprises two transistors T1, T2 arranged as a differential pair, degeneration resistors R1 connecting each emitter of said transistors T1, T2 to a current source 10 in the biasing stage. The collector of T1 constitutes the Output of the transconductance module V/I, while the collector of T2 is connected to a positive power supply terminal VCC via a resistor R2. The base of T1 is connected to the output of an operational amplifier A1 having an inverting input which is connected to the emitter of T1. The base of T2 is connected to the output of an operational amplifier A2 having an inverting input which is connected to the emitter of T2. The analog input voltage Vin is applied between the two non-inverting inputs of the two operational amplifiers A1 and A2.

This arrangement is an example of a transconductance module V/I whose output current Itr has a variable component which is independent of the current IO supplied by the current source. Indeed, the modulation of the base-emitter voltages of the transistors, which is due to a variation of IO, is divided by the higher gain of the operational amplifiers. As this gain is higher than 100, this modulation will be negligible. If itr is the variable component of the output current of the transconductance module and ic2 is the variable component of the current flowing through the collector of T2, then the difference itr-ic2 is equal to Vin/(2.R2). As itr=−ic2, itr=Vin/(4.R2). The output current of the transconductance module can thus be written as: Itr=IO/2+Vin/(4.R2), or Itr=IO/2+K'.Vin. The output voltage Vout of a gain-controlled amplifier as shown in FIG. 1 including transconductance modules V/I as shown in FIG. 2 will thus be Vout=Itr.R.CODE/$2^N$, i.e.:

$$Vout = IO.R.CODE/2^{N+1} + K'.Vin.CODE/2^N$$

Such a transconductance module thus allows the DC component of the analog output voltage of an amplifier to be set without the dynamic gain of this amplifier being modified. This is very useful for processing video signals, enabling its oscillations to be amplified in a variable manner without having to modify their DC level which constitutes a reference level and is used for subsequent processing of the amplified signal.

Figure 3:
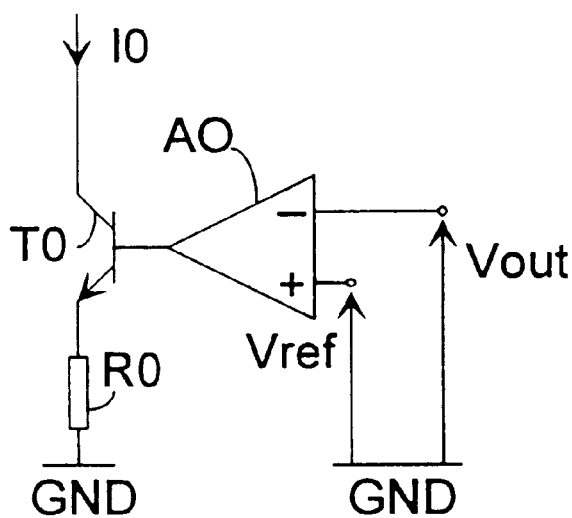
FIG. 3 is a diagram showing a device for setting the DC level in a gain-controlled amplifier in accordance with an advantageous embodiment of the invention.

FIG. 3 shows diagrammatically a device for setting the DC level of the analog output voltage of the amplifier. Such a device comprises a comparator AO having one output and two inputs, one of which receiving a reference voltage Vref while the other receives the output voltage Vout of the amplifier. FIG. 3 also shows one of the current sources of the biasing stage, constituted in this example by a transistor TO, whose emitter is connected to the negative power supply terminal GND via a resistor RO. The base of transistor TO constitutes the input for controlling the current value IO supplied by the current source. The output of the comparator AO is connected to the control input of each current source of the biasing stage. When the value CODE of the control word leads to a too high increase of Vout and thus to an increase of its DC level, the output voltage of the comparator AO will decrease, thus leading to a decrease of the conduction of TO. IO then decreases, which compensates the increase of CODE in the DC component of the analog input voltage Vout expressed in the equation $$Vout = IO.R.CODE/2^{N+1} + K'.Vin.CODE/2^N.$$

The dynamic gain remains unchanged.

Figure 4:
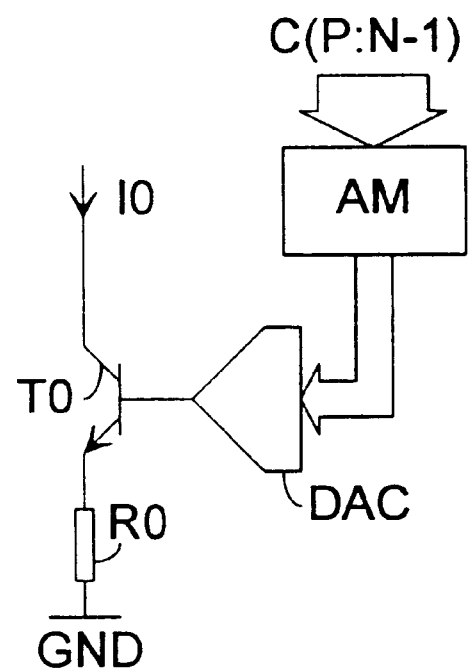
FIG. 4 is a diagram showing a device for setting the DC level in a gain-controlled amplifier in accordance with another advantageous embodiment of the invention.

FIG. 4 shows diagrammatically another device for setting the DC level of the analog output voltage of the amplifier. Such a device comprises an associative memory AM addressed by at least a part of the control word C(P:N−1) and supplying a precomputed digital value at the output, corresponding to the configuration of said part of the control word C(P:N−1). The setting device also comprises a D/A converter DAC having a digital input connected to the output of the associative memory AM. FIG. 4 also shows one of the current sources of the biasing stage, here constituted by a transistor TO, whose emitter is connected to the negative power supply terminal GND via a resistor RO. The base of transistor TO constitutes the input for controlling the value of the current IO supplied by the current source. The output of the D/A converter DAC is connected to the control input of each current source of the biasing stage. The associative memory allows the value of the current IO to be adjusted rapidly. Indeed to each different configuration of the part of the control word C(P:N−1) addressing the associative memory AM corresponds to a value stored in said memory, which value has been precomputed on the basis of the formula giving the value of the DC component of the analog Output voltage. This reciprocally yields the value for the biasing current IO as a function of the value of CODE, while the value of the DC level is fixed. The digital word associated with this value of CODE will thus be the word which, once converted to an analog form, will control the base of TO so that it will supply the previously computed current 10. The higher the number N-P−1 of bits of the part of the control word C(P:N−1) addressing the associative memory AM, the more it will contain precomputed values and the more precise the definition. The DC level setting of the analog output voltage is thus refined.

Figure 5:
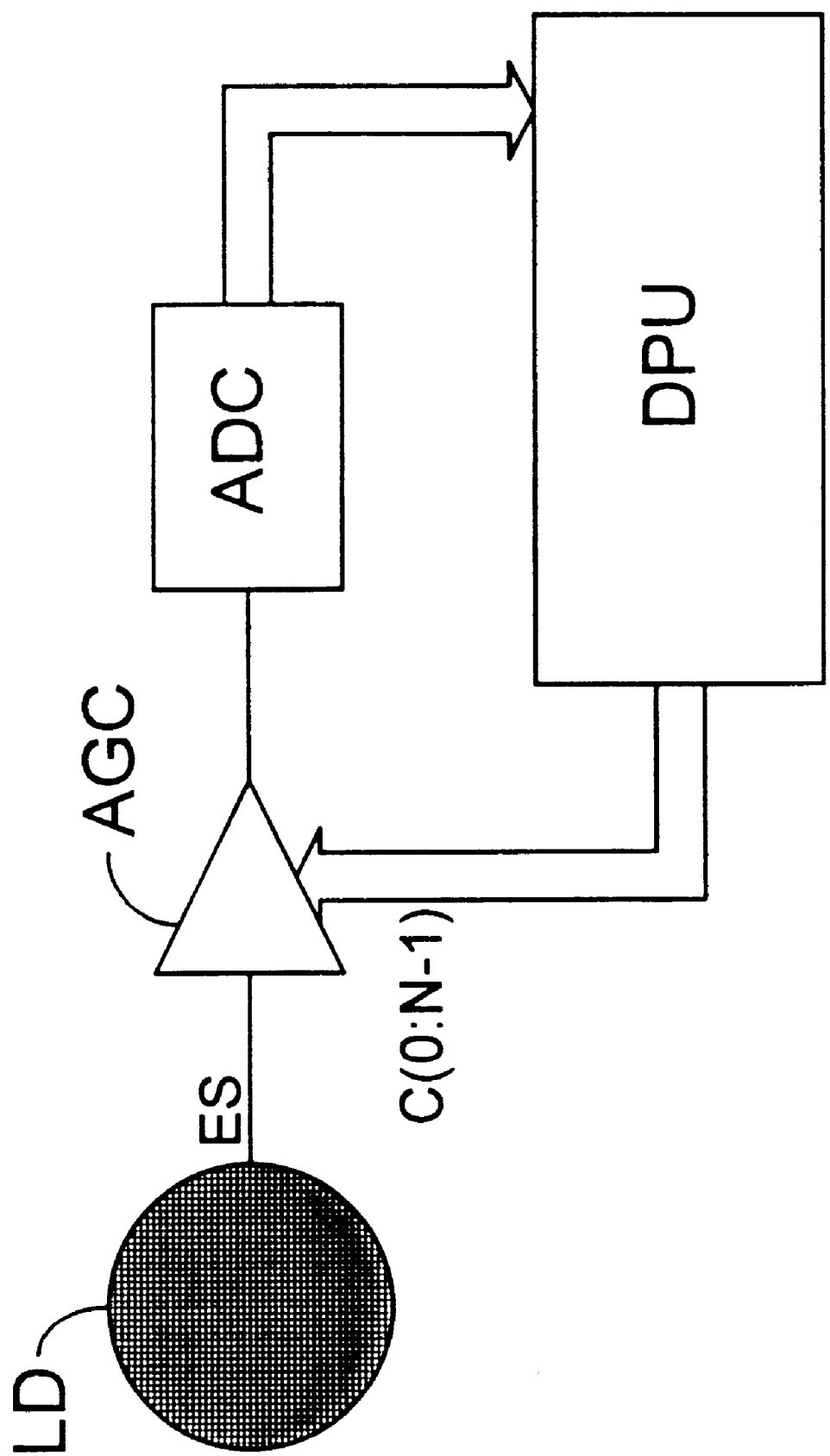
FIG. 5 is a diagram partially illustrating a camera in which a gain-controlled amplifier according to the invention is used.

FIG. 5 shows a diagram partially illustrating a camera comprising a gain-controlled amplifier according to the invention. Such a camera comprises:

a device LD for detecting light and for converting the light into analog electronic signals ES;

an amplifier AGC as described above, having an analog signal input which receives said analog electronic signals ES, a digital input which receives a digital word C(0:N−1), referred to as control word, for controlling the gain, and an analog signal output;

an A/D converter ADC having an analog input connected to the output of the amplifier AGC, and a digital output; and a digital processing unit DPU having an input which is connected to the output of the A/D converter ADC, which unit transmits the digital control word C(0:N−1) to the amplifier AGC.

The invention has been disclosed with reference to specific preferred embodiments, to enable those skilled in the art to make and use the invention, and to describe the best mode contemplated for carrying out the invention. Those skilled in the art may modify or add to these embodiments or provide other embodiments without departing from the spirit of the invention. Thus, the scope of the invention is only limited by the following claims:

We claim:

1. A gain-controlled amplifier having an analog input for receiving an analog input voltage, a digital input for receiving a word of N bits, referred to as control word, for controlling the gain of the amplifier, and an analog output for supplying an analog output voltage, comprising:

a transconductance stage having a differential voltage input which constitutes the analog input of the amplifier, and N current outputs, provided with means for producing, at each N current output, a current having a first variable component which is representative of the analog input voltage and a second variable component that is independent of the analog input voltage;

a switching stage having N control inputs and comprising N switches each controlled by a signal received at one of the N control inputs, each switch controlling the activation or deactivation of one of the current outputs of the transconductance stage, the N control inputs constituting the digital input of the amplifier for receiving the control word: and a current/voltage conversion stage having N current inputs and one voltage output, the N current inputs being connected to N current outputs of the transconductance stage, the voltage output constituting the analog output of the amplifier and supplying a voltage which is representative of the currents received at its N current inputs.

2. A gain-controlled amplifier having an analog input for receiving an analog input voltage, a digital input for receiving a word of N bits, referred to as control word, for controlling the gain of the amplifier, and an analog output for supplying an analog output voltage, comprising:

a biasing stage having N outputs and constituted by N current sources, each having a terminal connected to a negative power supply terminal, the other terminal constituting one of said N outputs;

a transconductance stage having a voltage input which constitutes the analog input of the amplifier, N current inputs connected to N outputs of the biasing stage, and N current outputs, and constituted by N transconductance modules each having a voltage input connected to the voltage input of the stage, a current input constituting a current input of the stage, and a current output constituting one of the N current outputs of the stage and supplying a current having a variable component which is representative of the analog input voltage;

a switching stage having N control inputs, N current inputs and N current outputs, and comprising N switches each controlled by a signal received at one of the N control inputs, one of the terminals of each switch constituting one of the N current inputs of the stage, the other terminal constituting one of the N current outputs of the stage, the N current inputs of the stage being connected to N current outputs of the transconductance stage, the N control inputs constituting the digital input of the amplifier for receiving the control word; and a current/voltage conversion stage having N current inputs and one voltage output, the N current inputs being connected to N current outputs of the switching stage, the voltage output constituting the analog output of the amplifier and supplying a voltage which is representative of the currents received at its N current inputs.

3. The gain-controlled amplifier as claimed in claim 1, in which the current/voltage conversion stage comprises an R/2R network in which two successive current inputs are interconnected via a resistor having a nominal value which is equal to R, the current input connected to the transconductance stage' output which is controlled by the most significant bit of the control word being connected to the analog output of the amplifier via a resistor having a nominal value which is equal to R, the current input connected to the transconductance stage's output which is controlled by the least significant bit of the control word being connected to the negative power supply terminal via a resistor having a nominal value which is equal to R, each of the other current inputs being connected to the negative power supply terminal via a resistor having a nominal value which is equal to 2R.

4. The gain-controlled amplifier as claimed in claim 2, in which all the current sources of the biasing stage have an identical construction and are each provided with a control input for controlling the current value supplied thereby as a function of the value of the control word.

5. The gain-controlled amplifier as claimed in claim 4, in which each transconductance module is provided with means for producing at its current output a current whose variable component is independent of the value of the current supplied by the current source to which said module is connected.

6. The gain-controlled amplifier as claimed in claim 5, in which the amplifier comprises a comparator having one output and two inputs, one of which receiving a reference voltage while the other receives the output voltage of the amplifier, the output of the comparator being connected to the control input of each current source of the biasing stage.

7. The gain-controlled amplifier as claimed in claim 5, in which the amplifier comprises an associative memory addressed by at least one part of the control word and supplying a precomputed digital value at its output corresponding to the configuration of said part of the control word, the amplifier also comprising a D/A converter having a digital input which is connected to the output of the associative memory and an analog output which is connected to the control input of each current source of the biasing stage.

8. A camera comprising:

a device for detecting light and converting the light into analog electronic signals;

an amplifier having an analog signal input intended to receive said analog electronic signals, a digital input intended to receive a digital word, referred to as control word, for controlling the gain of the amplifier, and an analog signal output;

an A/D converter having an analog input connected to the output of the amplifier, and a digital output;

a digital processing unit having an input connected to the output of the A/D converter, which unit is intended to apply the control word to the amplifier a transconductance stage having a differential voltage input which constitutes the analog input of the amplifier, and N current outputs, provided with means for producing, at each N current output, a current having a first variable component which is representative of the analog input voltage and a second variable component that is independent of the analog input voltage;

a switching stage having N control inputs and comprising N switches each controlled by a signal received at one of the N control inputs, each switch controlling the activation or deactivation of one of the current outputs of the transconductance stage, the N control inputs constituting the digital input of the amplifier for receiving the control word; and a current/voltage conversion stage having N current inputs and one voltage output, the N current inputs being connected to N current outputs of the transconductance stage, the voltage output constituting the analog output of the amplifier and supplying a voltage which is representative of the currents received at its N current inputs.

* * * * *